United States Patent
Adusumilli et al.

(10) Patent No.: US 8,999,799 B2
(45) Date of Patent: Apr. 7, 2015

(54) MASKLESS DUAL SILICIDE CONTACT FORMATION

(71) Applicant: International Business Machines Corporation, Armonk, NY (US)

(72) Inventors: Praneet Adusumilli, Albany, NY (US); Emre Alptekin, Wappingers Falls, NY (US); Kangguo Cheng, Schenectady, NY (US); Shom Ponoth, Gaithersburg, MD (US); Balasubramanian Pranatharthiharan, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/013,110

(22) Filed: Aug. 29, 2013

(65) Prior Publication Data
US 2015/0064863 A1    Mar. 5, 2015

(51) Int. Cl.
*H01L 21/00* (2006.01)
*H01L 21/8238* (2006.01)
*H01L 29/66* (2006.01)
*H01L 21/283* (2006.01)

(52) U.S. Cl.
CPC ...... *H01L 21/823814* (2013.01); *H01L 29/665* (2013.01); *H01L 21/283* (2013.01)

(58) Field of Classification Search
USPC ................................. 438/300, 592
See application file for complete search history.

(56) References Cited

U.S. PATENT DOCUMENTS

| | | | |
|---|---|---|---|
| 5,079,180 A * | 1/1992 | Rodder et al. | 438/297 |
| 6,063,675 A * | 5/2000 | Rodder | 438/291 |
| 6,160,282 A | 12/2000 | Merrill | |
| 7,067,368 B1 | 6/2006 | Fang et al. | |
| 7,972,958 B2 | 7/2011 | Lee et al. | |
| 2007/0123042 A1 | 5/2007 | Rim et al. | |
| 2007/0269970 A1 | 11/2007 | Purtell et al. | |
| 2009/0280645 A1 | 11/2009 | Lee et al. | |
| 2009/0294871 A1 | 12/2009 | Besser | |
| 2010/0164002 A1 | 7/2010 | Golonzka et al. | |
| 2011/0147855 A1 | 6/2011 | Joshi et al. | |

OTHER PUBLICATIONS

Anonymously disclosed, "All-In-One Integration for High Performance MOSFET Devices", IP.com No. IPCOM000154409D, Jun. 29, 2007.
Information Materials for IDS from WIPO Office Action FIS920130173PCT1.
International Search Report PCT/CN2014/084779.

* cited by examiner

*Primary Examiner* — Richard Booth
(74) *Attorney, Agent, or Firm* — Yuanmin Cai

(57) ABSTRACT

Embodiments of present invention provide a method of forming silicide contacts of transistors. The method includes forming a first set of epitaxial source/drain regions of a first set of transistors; forming a sacrificial epitaxial layer on top of the first set of epitaxial source/drain regions; forming a second set of epitaxial source/drain regions of a second set of transistors; converting a top portion of the second set of epitaxial source/drain regions into a metal silicide and the sacrificial epitaxial layer into a sacrificial silicide layer in a silicidation process wherein the first set of epitaxial source/drain regions underneath the sacrificial epitaxial layer is not affected by the silicidation process; removing selectively the sacrificial silicide layer; and converting a top portion of the first set of epitaxial source/drain regions into another metal silicide.

20 Claims, 6 Drawing Sheets

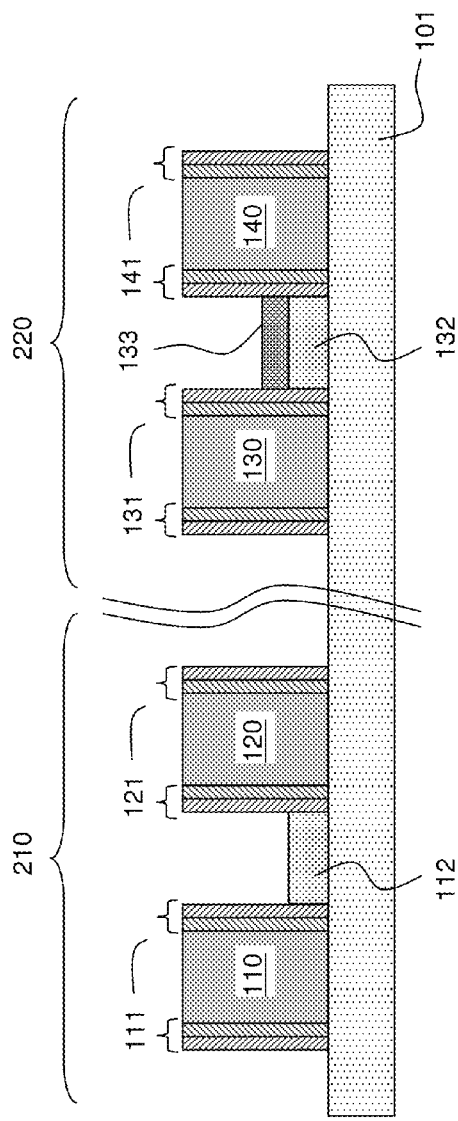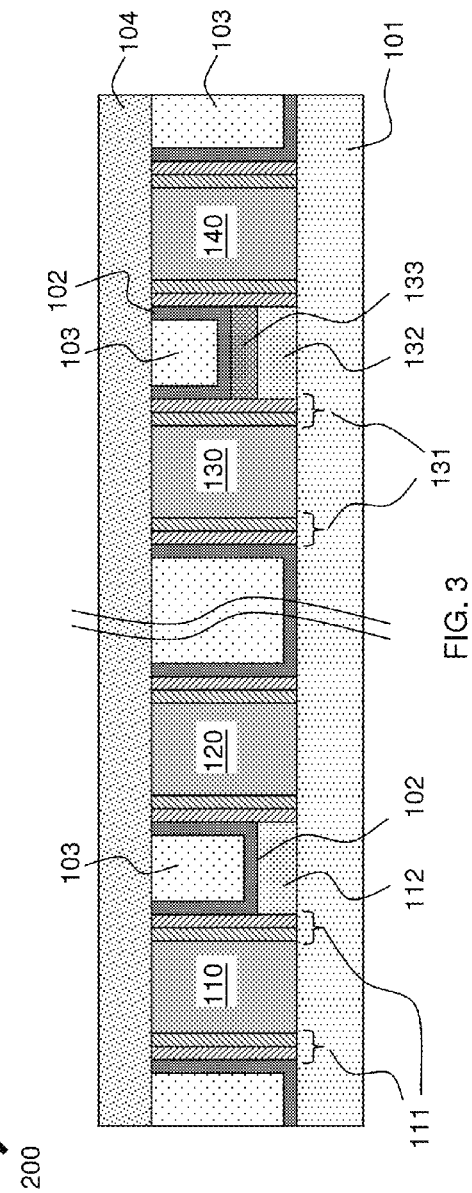

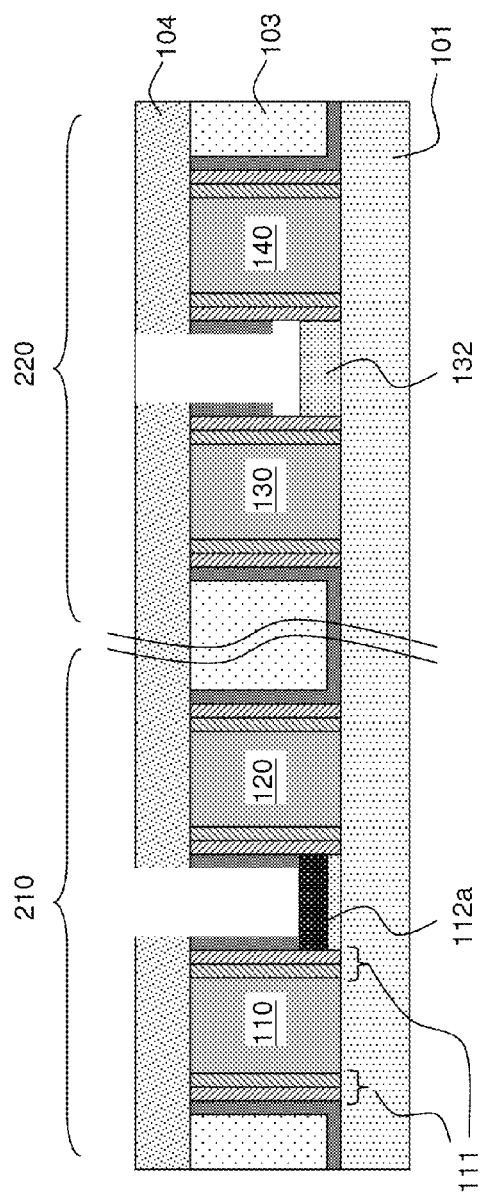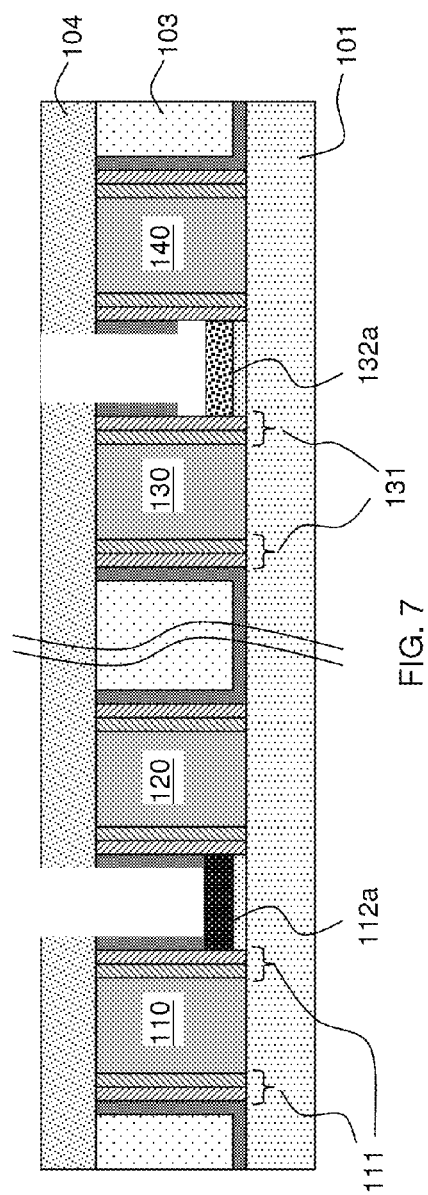

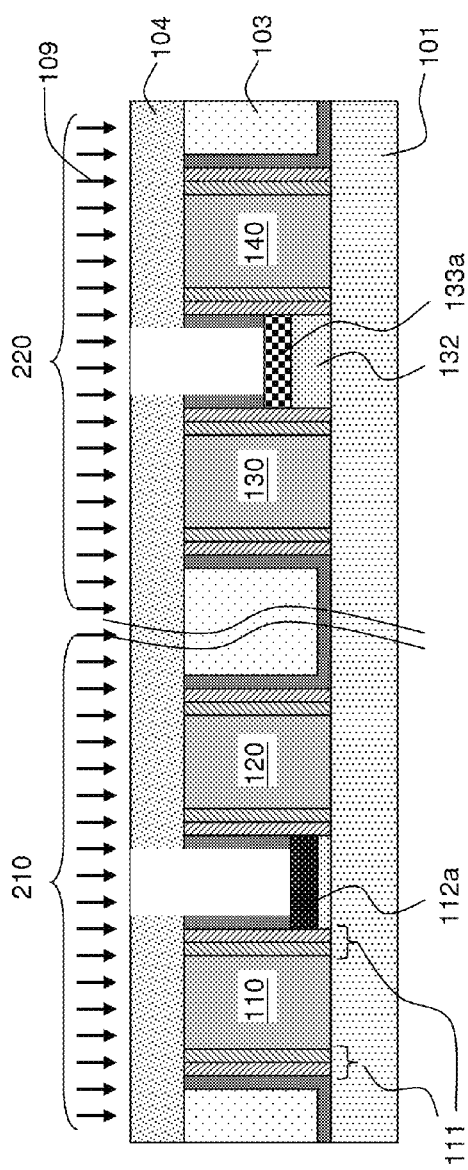
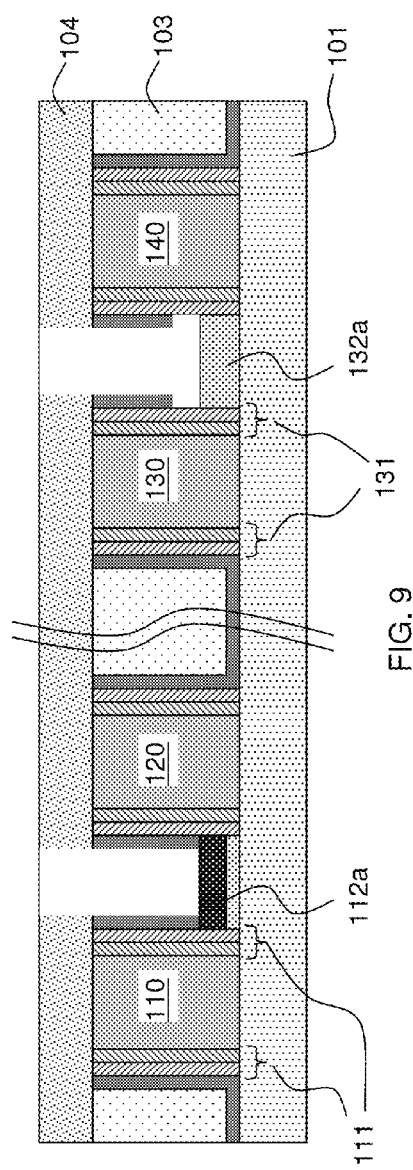

US 8,999,799 B2

MASKLESS DUAL SILICIDE CONTACT FORMATION

FIELD OF THE INVENTION

The present invention relates generally to the field of semiconductor device manufacturing and in particular relates to a maskless dual silicide contact formation process.

BACKGROUND

As manufacturing of complementary-metal-oxide-semiconductor (CMOS) transistors continues to scale, resistance at interfaces of source/drain (S/D) and silicide formed thereupon becomes more and more a dominant factor or contributor towards the overall external parasitic resistance. As S/D contact dimensions are further scaled, conventional approaches and/or methods are no longer capable of handling interface resistance.

There are several approaches and/or methods being recently developed in order to achieve lower contact resistance at the source and/or drain of n-type and/or p-type transistors. Ion implantation into the silicide region is one approach and forming dual silicide is another approach. However, these approaches all require additional masks and complicated integration scheme associated therewith. For example, these two approaches require the formation of soft/hard masks. Additionally, together with the formation of these masks, there is difficulty in the removal of these masks in small contact opening areas.

SUMMARY OF EMBODIMENTS OF THE INVENTION

Embodiments of present invention provide a method of forming suicides of different types, and in particular forming silicide contacts for both p-type and n-type transistors in an integrated process. The method includes forming a first set of epitaxial source/drain regions of a first set of transistors; forming a sacrificial epitaxial layer on top of the first set of epitaxial source/drain regions; forming a second set of epitaxial source/drain regions of a second set of transistors; and converting at least a top portion of the second set of epitaxial source/drain regions into a metal silicide and the sacrificial epitaxial layer into a sacrificial silicide layer in a silicidation process, wherein the first set of epitaxial source/drain regions underneath the sacrificial epitaxial layer is not affected by the silicidation process.

In one embodiment, converting the at least a top portion of the second set of epitaxial source/drain regions into the metal silicide includes depositing a layer of metal element on top of the second set of epitaxial source/drain regions and on top of the sacrificial epitaxial layer; and causing the layer of metal element to react with the second set of epitaxial source/drain regions and react with the sacrificial epitaxial layer, thereby forming the metal silicide and sacrificial silicide layer respectively.

In another embodiment, the second set of transistors are n-type transistors, and depositing the layer of metal element includes depositing a layer of metallic material, with the metallic material being selected from a group consisting of Er, Yb, Tb, and Ti.

According to one embodiment, the method further includes performing ion implantation into the metal silicide while the sacrificial silicide layer preventing the first set of epitaxial source/drain regions from being affected by the ion implantation, the ion implantation causing reduction in contact resistance of the metal silicide.

In one embodiment, the method further includes performing ion implantation, before converting the at least a top portion of the second set of epitaxial source/drain regions into the metal silicide, into the second set of epitaxial source/drain regions, while the sacrificial epitaxial layer covering the first set of epitaxial source/drain regions from the ion implantation.

In one embodiment, the metal silicide is a second metal silicide, the method further includes removing the sacrificial silicide layer to expose a top surface of the first set of epitaxial source/drain regions of the first set of transistors; and converting at least a top portion of the first set of epitaxial source/drain regions into a first metal silicide.

Moreover, in one embodiment, removing the sacrificial silicide layer further includes applying a selective etching process to remove the sacrificial silicide layer without affecting the second metal silicide and without affecting the first set of epitaxial source/drain regions underneath the sacrificial silicide layer.

In another embodiment, converting the at least a top portion of the first set of epitaxial source/drain regions into the first metal silicide includes depositing a layer of metal element on top of the first set of epitaxial source/drain regions and on top of the second metal silicide; and causing the layer of metal element to react with the first set of epitaxial source/drain regions to form the first metal silicide while the second metal silicide stays substantially unaffected by the layer of metal element.

In yet another embodiment, the first set of transistors are p-type transistors, and depositing the layer of metal element includes depositing a layer of metallic material, the metallic material being selected from a group consisting of Ni, Pt, Pd, and Lr.

According to one embodiment, the first and second epitaxial source/drain regions are epitaxial silicon regions, and forming the sacrificial epitaxial layer includes epitaxially growing a germanium (Ge) layer directly on top of the first epitaxial source/drain regions.

BRIEF DESCRIPTION OF THE DRAWINGS

The present invention will be understood and appreciated more fully from the following detailed description of preferred embodiments, taken in conjunction with the accompanying drawings of which:

FIG. 2 is a demonstrative illustration of a cross-sectional view of a semiconductor device in a step of a method of manufacturing thereof according to one embodiment of present invention;

FIG. 3 is a demonstrative illustration of a cross-sectional view of a semiconductor device in a step of a method of manufacturing thereof, after the step illustrated in FIG. 2, according to another embodiment of present invention;

FIG. 6 is a demonstrative illustration of a cross-sectional view of a semiconductor device in a step of a method of manufacturing thereof, after the step illustrated in FIG. 5, according to one embodiment of present invention;

FIG. 7 is a demonstrative illustration of a cross-sectional view of a semiconductor device in a step of a method of manufacturing thereof, after the step illustrated in FIG. 6, according to another embodiment of present invention;

FIG. 8 is a demonstrative illustration of a cross-sectional view of a semiconductor device in a step of a method of manufacturing thereof, after the step illustrated in FIG. 5, according to yet another embodiment of present invention;

FIG. 9 is a demonstrative illustration of a cross-sectional view of a semiconductor device in a step of a method of manufacturing thereof, after the step illustrated in FIG. 8, according to yet a further embodiment of present invention.

Figure 1:
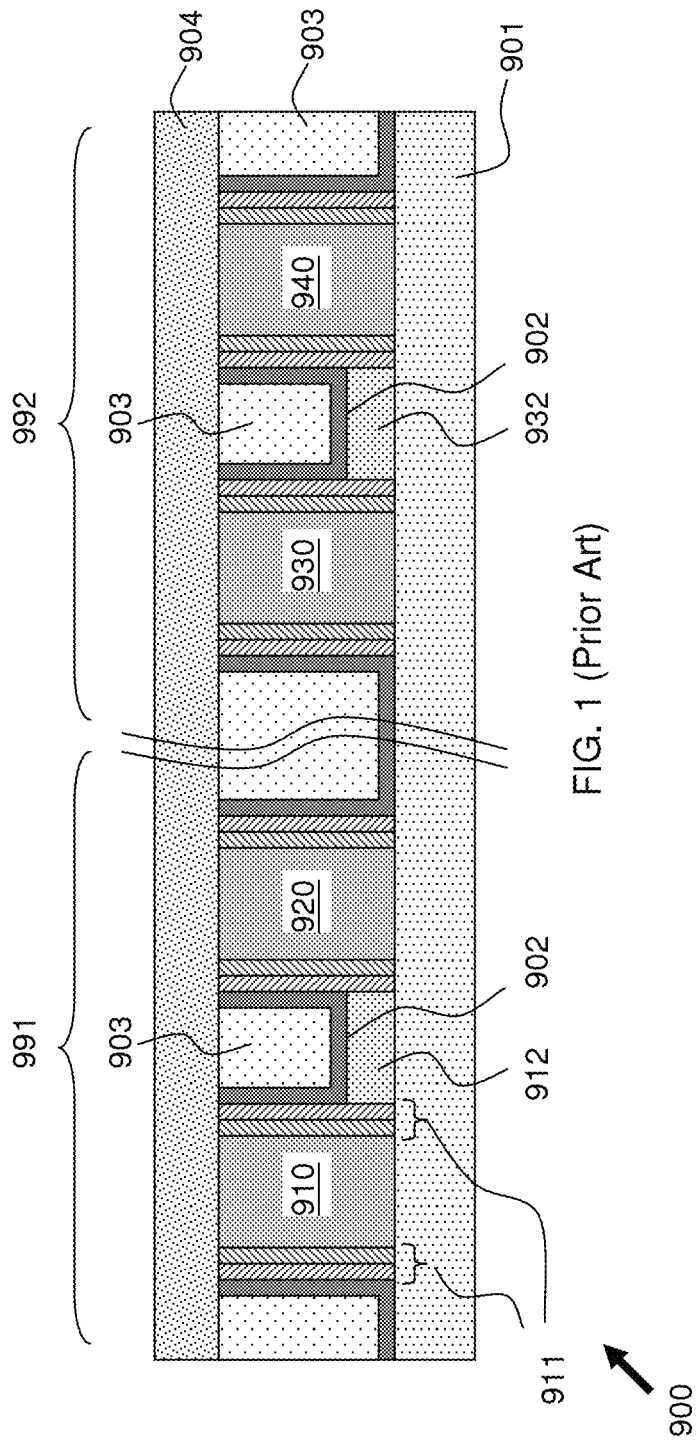
FIG. 1 is a demonstrative illustration of a cross-sectional view of a semiconductor device as is known in the art.

It will be appreciated that for purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF EMBODIMENTS OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

FIG. 1 is a demonstrative illustration of a cross-sectional view of a semiconductor device as is known in the art. In a typical process of manufacturing, a semiconductor device 900 may be fabricated to have a substrate 901, such as a semiconductor substrate, upon which a plurality of gate structures may be formed. For example, semiconductor device 900 may have a first region 991 of substrate 901 that contains a first gate 910 and a second gate 920 of, for example, n-type transistors and a second region 992 of substrate 901 that contains a third gate 930 and a fourth gate 940 of, for example, p-type transistors. The plurality of gates 910, 920, 930, and 940, which may be referred to as gate structures as well, may have one or more sidewall spacers formed adjacent to sidewalls thereof. For example, sidewall spacers 911 may be formed adjacent to sidewalls of gate structure 910, as illustrated in FIG. 1.

Conventionally, after the formation of sidewall spacers, source and/or drain (source/drain) and sometimes raised source/drain may be formed. For example, source/drain 912 and 932 may be formed through an epitaxial growth process. Subsequently, one or more stress liners 902 may be formed, through deposition, on top of gate structures 910, 920, 930, 940 as well as on top of epitaxial grown source/drain regions 912 and 932 to apply stress to channel regions of respective transistors for increased carrier mobility. For example, a compressive stress liner may be applied on top of and surrounding gate structures 930 and 940 of p-type transistors, in the 992 region, to increase hole mobility, and a tensile stress liner may be applied on top of and surrounding gate structures 910 and 920 of n-type transistors, in the 991 region, to increase electron mobility.

After applying stress liners, current conventional process may continue to deposit a dielectric material 903, which fills up spaces and/or gaps between gate structures 910, 920, 930, and 940, and then apply a chemical-mechanic-polishing (CMP) process to create a planar top surface. Particularly, in a conventional replacement-metal-gate (RMG) process, gate structures 910, 920, 930, and 940 may be dummy gate structures and stress liner 902 and dielectric material 903 on top of dummy gate structures 910, 920, 930, and 940 may be removed by the CMP process. Materials of dummy gate structures 910, 920, 930, and 940, for example silicon, may be removed and then replaced with other functional metal and/or metallic material thereby forming metal gates. After the formation of metal gates, an inter-layer-dielectric (ILD) layer 904 may be deposited on top of dielectric material 903 and the metal gate structures. Contacts to source and/or drain may then be formed through ILD layer 904 and dielectric material 903 to contact source and/or drain 912 and 932 including forming silicides thereof.

In order to form contacts to source/drain 912 and 932 with low contact resistance, for example through implantation and/or dual silicide, additional mask and together with complicated integration scheme may be required due to soft/hard mask formation and the difficulty in the removal of dielectric material within small contact openings.

FIG. 2 is a demonstrative illustration of a cross-sectional view of a semiconductor device in a step of a method of manufacturing thereof according to one embodiment of present invention. More specifically, one embodiment of present invention includes forming a semiconductor device 200 on a semiconductor substrate 101. In forming semiconductor device 200, a plurality of gate structures may be formed first. The plurality of gate structures may include, in a first region 210 of substrate 101, a first set of gate structures 110 and 120 corresponding to a first set of n-type transistors for example and, in a second region 220 of substrate 101, a second set of gate structures 130 and 140 corresponding to a second set of p-type transistors for example.

One embodiment of present invention may further include forming one or more sets of sidewall spacers next to respective sidewalls of gate structures 110, 120, 130, and 140. For example, gate structures 110, 120, 130, and 140 may have their respective sidewall spacers 111, 121, 131, and 141 formed as being demonstratively illustrated in FIG. 2. Sidewall spacers may be formed through, for example, depositing a conformal dielectric layer first, and then applying a directional etching process such as a reactive-ion-etching process to remove lateral portions of the conformal dielectric layer leaving only the vertical portions at sidewalls of the gate structures.

Following the formation of spacers 111, 121, 131, and 141 at sidewalls of gate structures 110, 120, 130, and 140, source and/or drain (source/drain) of both n-type and p-type transistors may be formed, for example, through an epitaxial growth process. For example, an epitaxial source/drain region 112 may be formed between gate structures 110 and 120 and an epitaxial source/drain region 132 may be formed between gate structures 130 and 140. Other source/drain regions may be formed as well, surrounding various gate structures. However, these source/drain regions are not illustrated here in order not to obscure description of present invention. The source/drain regions may be regular planar source/drain regions and/or may be raised source/drain regions.

According to one embodiment of present invention, following the formation of source/drain region 132 in the p-type transistor region 220, a sacrificial layer or sacrificial cap layer 133 may be formed on top of the epitaxially grown source/drain region 132. The formation of sacrificial cap layer 133 may be performed immediately following the epitaxial growth of source/drain 132, and in one instance before the formation of epitaxial source/drain region 112, such that no additional mask may be needed. In other words, the epitaxial growth of source/drain 132 and the formation of sacrificial cap layer 133 may share the same mask that protects the n-FET transistor regions 210 during the process.

Sacrificial cap layer 133 may be a sacrificial epitaxial cap layer 133 to be, for example, an epitaxial germanium (Ge) cap layer or an epitaxial silicon-germanium (SiGe) cap layer, and it may be formed directly on top of source/drain region 132. However, embodiment of present invention may not be limited in the above aspects and other suitable materials may be used as well in forming sacrificial epitaxial cap layer 133. For example, according to one embodiment, a material that may form a silicide such that the silicide formed thereby may be etched away selectively from the underneath epitaxial source/drain region and/or selectively from a silicide formed in source/drain region 112 of the n-type region 210, as being described below in more details, may be used. For example, in one embodiment, sacrificial epitaxial cap layer 133 may be of the same material as that of underneath source/drain 132. In other words, source/drain 132 may be formed to have an additional thickness and the additional thickness may act as a sacrificial layer to form a sacrificial silicide, in subsequent process steps, such that the sacrificial silicide in turn protects rest of source/drain 132.

According to one embodiment, although not illustrated in FIG. 2, a sacrificial epitaxial cap layer may be formed on top of source/drain region 112 in the n-type transistor region 210 of substrate 101, instead of on top of source/drain region 132 in the p-type transistor region 220 as being described above. Similarly, the sacrificial epitaxial cap layer may be formed immediately after the formation of source/drain region 112, before or after the formation of source/drain region 132. Other process steps, as being described above with regard to sacrificial epitaxial cap layer 133, may similarly be applied.

FIG. 3 is a demonstrative illustration of a cross-sectional view of a semiconductor device in a step of a method of manufacturing thereof, after the step illustrated in FIG. 2, according to another embodiment of present invention. More specifically, one embodiment of present invention may include optionally forming stress liner or liners 102 covering gate structures 110, 120, 130, and 140, and on top of formed source/drain 112 and on top of sacrificial layer 133. Embodiment of present invention may continue performing other steps of forming the n-type and p-type transistors following currently known or future developed techniques until it becomes ready to form source/drain contact. For example, embodiment of present invention may include filling spaces and/or gaps between gate structures with a dielectric material 103. In a replacement-metal-gate process, embodiment of present invention further includes applying a CMP process to open the top of gate structures 110, 120, 130, and 140 to expose underneath dummy gates; replacing dummy gate materials with functional metal and other proper metal gate material; and depositing a ILD layer 104 on top of gate structures.

Here it is to be noted that, when being comparing with current process that is demonstratively illustrated in FIG. 1, embodiment of present invention integrated a sacrificial epitaxial cap layer 133 in the process of forming epitaxial source/drain region 112 or 132. The formation of sacrificial epitaxial cap layer 133 does not require any additional mask and is generally formed immediately following the formation of underneath source/drain region.

Figure 4:
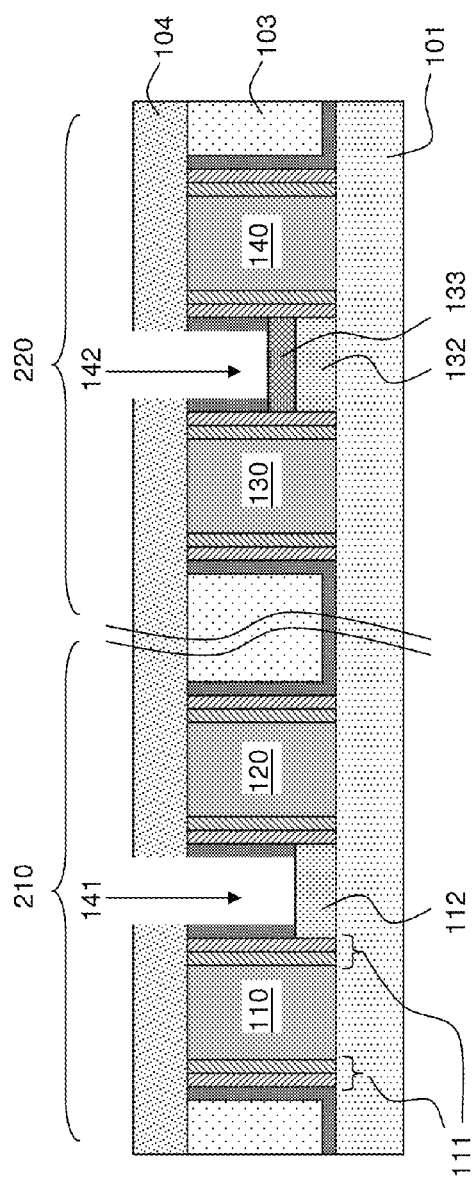
FIG. 4 is a demonstrative illustration of a cross-sectional view of a semiconductor device in a step of a method of manufacturing thereof, after the step illustrated in FIG. 3, according to yet another embodiment of present invention.

FIG. 4 is a demonstrative illustration of a cross-sectional view of a semiconductor device in a step of a method of manufacturing thereof, after the step illustrated in FIG. 3, according to yet another embodiment of present invention. More specifically, one embodiment of present invention includes creating openings, via holes, or contact holes in designated source/drain regions. For example, one embodiment of present invention may include creating contact holes 141 and 142, as being illustrated in FIG. 4, thereby exposing underneath epitaxially grown source/drain region 112 and sacrificial epitaxial layer 133. The creation of contact holes 141 and 142 may be achieved by applying any standard lithographic patterning process first to create a photo-resist mask exposing the areas (directly above the source/drain regions 112 and 132) that are to be etched away, and then applying a selective etching process such as a reactive-ion-etching (RIE) process to remove the dielectric material 103 that are on top of source/drain 112 and on top of sacrificial epitaxial cap layer 133, utilizing difference in etch-rate between dielectric material 103 and epitaxially grown material 112 and 133.

In one embodiment, contact holes 141 and 142 may be made self-aligned to gate structures 110, 120, 130, and 140. For example, by using different dielectric materials, with different etch rate, for sidewall spacers 111, 121, 131, and 141 of the gate structures and for dielectric layer 103, contact holes 141 and 142 may be made self-aligned to sidewall spacers. Care may be exercised not to open the top of gate structures 110, 120, 130, and 140.

Figure 5:
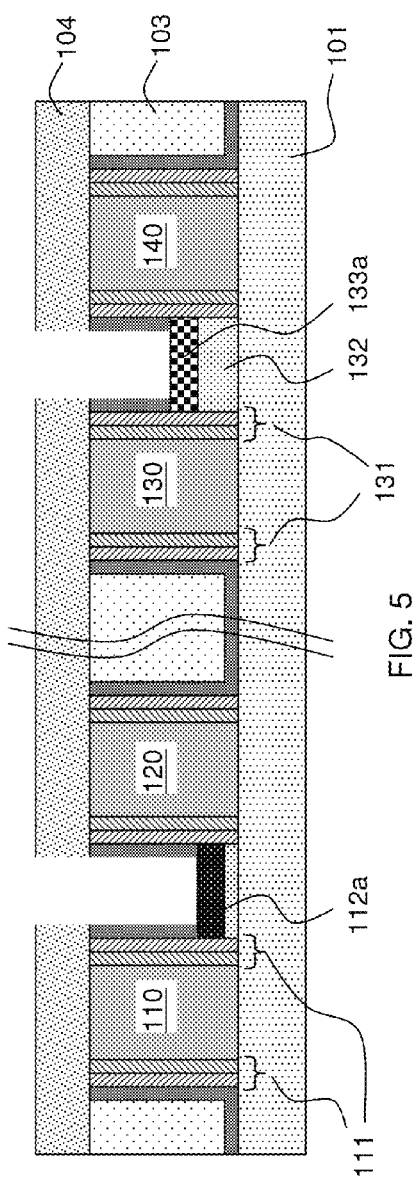
FIG. 5 is a demonstrative illustration of a cross-sectional view of a semiconductor device in a step of a method of manufacturing thereof, after the step illustrated in FIG. 4, according to yet a further embodiment of present invention.

FIG. 5 is a demonstrative illustration of a cross-sectional view of a semiconductor device in a step of a method of manufacturing thereof, after the step illustrated in FIG. 4, according to yet a further embodiment of present invention. More specifically, after source/drain region 112 is exposed, a layer of a first metal, metallic or semiconductor element may be deposited on top of source/drain region 112.

In cases where the first metal, metallic or semiconductor element is deposited on top of source/drain region 112 of n-type transistor in the n-type transistor region 210, the element may preferably include, for example, Er, Yb, Tb, and/or Ti that are known as low work-function metals. Silicide formed by these low work-function metals generally have conduction band edge and low electron barrier height that are particularly suitable for n-type transistors, where electrons are the major carrier, thereby resulting in lower contact resistance and other parasitic resistance. In cases where the first metal, metallic or semiconductor element is deposited to form silicide for source/drain of p-type transistors, the element may preferably include, for example, Ni, Pt, Pd, and/or Lr that are known as high work-function metals. Silicide formed by these high work-function metals generally have valance band edge and lower hole barrier height that are particular suitable for p-type transistors, where holes are the major carrier, resulting in lower contact resistance and other parasitic resistance.

The deposited metal layer is subsequently subjected to an annealing process, such as a thermal annealing process or a laser annealing process, to cause at least a top portion of source/drain region 112 to be converted into a metal silicide 112a. During the process of forming metal silicide 112a, the same first metal element may be deposited on top of sacrificial cap layer 133 as well and thus the subsequent annealing process may convert sacrificial cap layer 133 into a sacrificial metal reacted cap layer 133a. For example, when sacrificial cap layer 133 is a germanium layer, the metal reacted cap layer or cap region 133a may be a germanide. The germanide layer 133a is material different from the underneath silicon epitaxial layer 132 and different from metal silicide 112a as well, and thus may be able to provide an etch-rate difference suitable for following selective etching process.

FIG. 6 is a demonstrative illustration of a cross-sectional view of a semiconductor device in a step of a method of manufacturing thereof, after the step illustrated in FIG. 5, according to one embodiment of present invention. Following the formation of metal silicide 112a, metal reacted cap layer 133a on top of source/drain 132 may be selectively removed. The selective removing process may be accomplished by applying a wet removal process, a dry etch process, or a combination thereof. For example, when applying a wet removal process to remove metal reacted cap layer 133a, solutions such as SPM ($H_2SO_4/H_2O_2/H_2O$ mixture) and aqua regia ($HCl/HNO_3$ mixture), may be used. The solution may etch germanides or germanosilicides with Ge concentration level above 30%. Further for example, a reactive-ion-etching (RIE) may be used in a dry etch process to remove metal reacted cap layer 133a. The process of removing metal reacted cap layer 133a may be selective primarily to metal silicide 112a such that metal silicide 112a may be little affected or not be affected at all while the etching of metal reacted cap layer 133a may be, for example, timed. Alternately and preferably, the removal process of metal reacted cap layer 133a is selective to both metal silicide 112a and to underneath source/drain region 132. For example, aqua regia is known to be selective to Si, SiGe, and nickel silicide but etches nickel germanide, and thus may be used in the above selective etch process. Removal of sacrificial metal reacted cap layer 133a may expose underneath source/drain region 132 ready to form silicide.

FIG. 7 is a demonstrative illustration of a cross-sectional view of a semiconductor device in a step of a method of manufacturing thereof, after the step illustrated in FIG. 6, according to another embodiment of present invention. After epitaxial source/drain region 132 is exposed by removing the above metal reacted cap layer 133a, a layer of a second metal element may be deposited on top of source/drain region 132.

In cases that the second metal element is deposited on top of source/drain region 132 of p-type transistor in the p-type transistor region 220, the metal element may preferably include, for example, Ni, Pt, Pd and/or Lr such that the formed silicide may have a relatively low contact resistance because of a valance band edge with low hole barrier height. However, embodiment of present invention is not limited in this aspect, and in cases where the second metal element is deposited to form silicide in the source/drain region of n-type transistors after the first metal element was deposited to form silicide for source/drain region of p-type transistors, the second metal element may preferably include, for example, Er, Yb, Tb, and/or Ti such that the formed metal silicide may have a relatively low contact resistance because of a conduction band edge with low electron barrier height.

The deposited second metal or metal element may subsequently be subjected to an annealing process, causing the metal element to react with underneath source/drain region 132 which may be an epitaxially grown silicon, germanium, or silicon-germanium, to name a few. The annealing process may cause at least a top portion of source/drain region 132 to be converted into a metal silicide 132a, as being demonstratively illustrated in FIG. 7.

In the meantime, when the second metal element is deposited on top of source/drain region 132, top of the metal silicide 112a in the n-type transistor region 210 may also be covered by the same second metal element, so is rest of the top surface of dielectric layer 104. However, since metal silicide 112a is already a silicide with no more exposed source/drain region 112, no silicidation or no significant silicidation may occur during the silicidation of source/drain region 132. In other words, the metal layer of the second metal element on top of metal silicide 112a may stay at least substantially un-reacted during the silicidation of source/drain region 132. On the other hand, since layer 104 is a dielectric layer, metal layer of the second metal element that is deposited on top of the dielectric layer 104 may stay at least substantially un-reacted as well during the silicidation of source/drain region 132. The substantially un-reacted second metal elements on top of dielectric layer 104 and on top of metal silicide 112a may be removed after forming metal silicide 132a in the top portion of source/drain region 132. In the meantime, any un-reacted portion of second metal element on top of the formed metal silicide 132a may be removed as well.

Based upon the above process, embodiment of present invention provides a method of forming source/drain silicide of different kinds for different types of transistors, in particular p-type and n-type transistors. However, embodiment of present invention is not limited in this aspect. For example, the above process may be applied in forming silicide not only for source/drain, but also for forming silicide on top of gate structures of different transistors. Furthermore, embodiment of present invention may be applied to forming silicides of more than two different types. For example, the process may be applied to form any number of different types of silicides by simply repeating the above process. It is to be noted that the above process of forming multiple different types of silicides, unlike any existing conventional approaches, does not require forming separate masks, which dramatically reduces the complexity of the overall device manufacturing process.

FIG. 8 is a demonstrative illustration of a cross-sectional view of a semiconductor device in a step of a method of manufacturing thereof, after the step illustrated in FIG. 5, according to yet another embodiment of present invention. More specifically, after forming metal silicide 112a for source/drain 112 in n-type transistor region 210, shallow ion implantation 109 may be performed in metal silicide 112a to, for example, further reduce contact resistance thereof. According to one embodiment of present invention, shallow ion implantation 109 may be performed as a blank implantation without the need to form any additional mask covering source/drain region 132 because source/drain region 132 is already covered by sacrificial cap layer 133a, which is now a metal reacted cap layer. In the meantime, rest of device areas are covered by dielectric layer 104 and no mask is needed either.

FIG. 9 is a demonstrative illustration of a cross-sectional view of a semiconductor device in a step of a method of manufacturing thereof, after the step illustrated in FIG. 8, according to yet a further embodiment of present invention. Following the shallow ion implantation 109 as being illustrated in FIG. 8, which may be applied to improve performance of metal silicide 112a such as reducing contact resistance, as well as any additional processing steps by taking advantage of using sacrificial metal reacted cap layer 133a to protect source/drain region 132, sacrificial metal reacted cap layer 133a may be selectively removed.

Some etch properties of sacrificial metal reacted cap layer 133a may more or less be changed due to this additional ion implantation step, as compared with the metal reacted cap layer 133a illustrated in FIG. 6 which follows directly the silicidation step of source/drain 112, and thus some minor adjustment in the selective etching process may be needed if necessary. In removing metal reacted cap layer 133a of, for example, Ge or SiGe with high Ge concentration in a wet etch process, dilute peroxide $H_2O_2/H_2O$, ($NH_4OH:H_2O_2$) or $HNO_3:H_2O:HF$ solutions may be used. Other dry etch processes (e.g. $SF_6$ or $Cl_2$ based RIE process) may be used as well to selectively etch Ge or SiGe over Si. The selective etching process may expose underneath source/drain region 132 and prepare the source/drain region for subsequent silicidation process, such as that described above with reference to FIG. 7.

Figure 10:
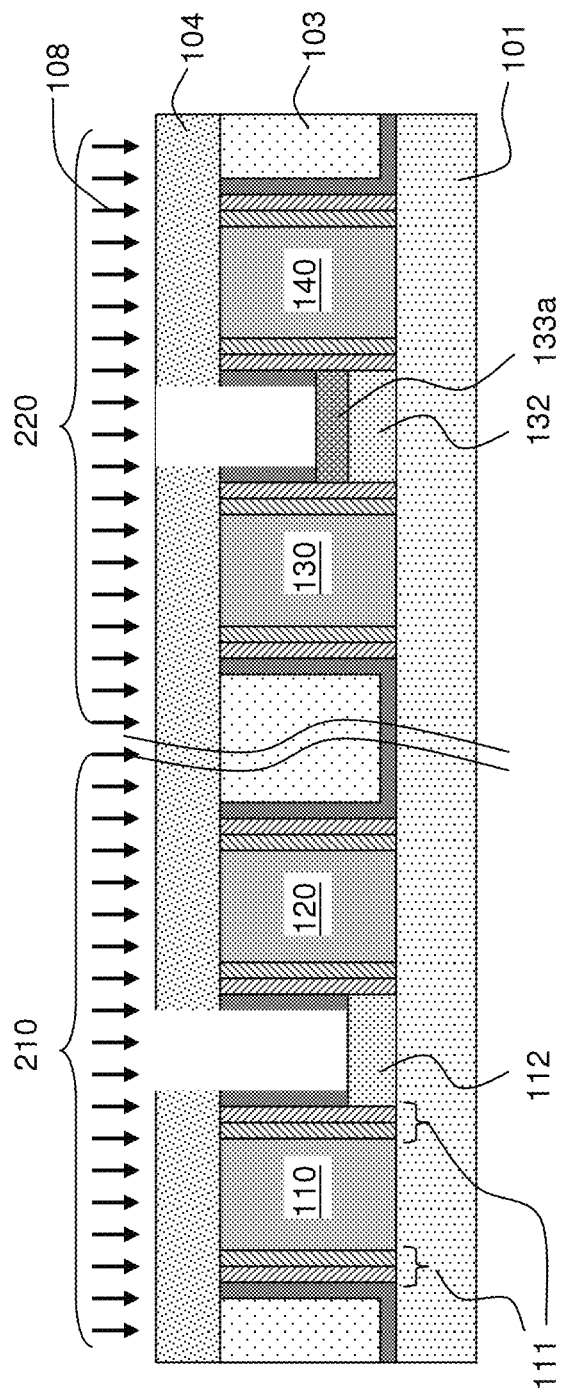
FIG. 10 is a demonstrative illustration of a cross-sectional view of a semiconductor device in a step of a method of manufacturing thereof, after the step illustrated in FIG. 4, according to one embodiment of present invention.

FIG. 10 is a demonstrative illustration of a cross-sectional view of a semiconductor device in a step of a method of manufacturing thereof, after the step illustrated in FIG. 4, according to one embodiment of present invention. More specifically, after forming epitaxial source/drain region 112 of n-type transistor and epitaxial source/drain region 132 of p-type transistor with integrated sacrificial cap layer 133 on top of, for example, source/drain region 132, one embodiment of present invention may include performing an ion implantation 108 to implant certain dopants into source/drain region 112 that may help reduce contact resistance after forming silicide. The ion implantation requires no additional mask to cover source/drain region 132 because of the presence of sacrificial cap layer 133 on top thereof. In other words, sacrificial cap layer 133 may shield source/drain region 132 from ion implantation 108. Following ion implantation 108, source/drain region 112 may be prepared to form metal silicide 112a, as being described above in detail with reference to FIG. 5.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
    forming a first set of epitaxial source/drain regions of a first set of transistors;
    forming a sacrificial epitaxial layer on top of said first set of epitaxial source/drain regions;
    forming a second set of epitaxial source/drain regions of a second set of transistors; and
    converting at least a top portion of said second set of epitaxial source/drain regions into a metal silicide and said sacrificial epitaxial layer into a sacrificial silicide layer in a silicidation process,
    wherein said first set of epitaxial source/drain regions underneath said sacrificial epitaxial layer is not affected by said silicidation process.

2. The method of claim 1, wherein converting said at least a top portion of said second set of epitaxial source/drain regions into said metal silicide comprises:
    depositing a layer of metal element on top of said second set of epitaxial source/drain regions and on top of said sacrificial epitaxial layer; and
    causing said layer of metal element to react with said second set of epitaxial source/drain regions and react with said sacrificial epitaxial layer, thereby forming said metal silicide and said sacrificial silicide layer respectively.

3. The method of claim 1, wherein said second set of transistors are n-type transistors, and depositing said layer of metal element comprises depositing a layer of metallic material, said metallic material being selected from a group consisting of Er, Yb, Tb, and Ti.

4. The method of claim 1, further comprising performing ion implantation into said metal silicide while said sacrificial silicide layer preventing said first set of epitaxial source/drain regions from being affected by said ion implantation, said ion implantation causing reduction in contact resistance of said metal silicide.

5. The method of claim 1, further comprising performing ion implantation, before converting said at least a top portion of said second set of epitaxial source/drain regions into said metal silicide, into said second set of epitaxial source/drain regions, while said sacrificial epitaxial layer covering said first set of epitaxial source/drain regions from said ion implantation.

6. The method of claim 1, wherein said metal silicide is a second metal silicide, further comprising:
    removing said sacrificial silicide layer to expose a top surface of said first set of epitaxial source/drain regions of said first set of transistors; and
    converting at least a top portion of said first set of epitaxial source/drain regions into a first metal silicide.

7. The method of claim 6, wherein removing said sacrificial silicide layer further comprises applying a selective etching process to remove said sacrificial silicide layer without affecting said second metal silicide and without affecting said first set of epitaxial source/drain regions underneath said sacrificial silicide layer.

8. The method of claim 6, wherein converting said at least a top portion of said first set of epitaxial source/drain regions into said first metal silicide comprises:
    depositing a layer of metal element on top of said first set of epitaxial source/drain regions and on top of said second metal silicide; and
    causing said layer of metal element to react with said first set of epitaxial source/drain regions to form said first metal silicide while said second metal silicide stays substantially unaffected by said layer of metal element.

9. The method of claim 8, wherein said first set of transistors are p-type transistors, and depositing said layer of metal element comprises depositing a layer of metallic material, said metallic material being selected from a group consisting of Ni, Pt, Pd, and Lr.

10. The method of claim 1, wherein said first and second epitaxial source/drain regions are epitaxial silicon regions, and forming said sacrificial epitaxial layer comprises epitaxially growing a germanium (Ge) layer directly on top of said first epitaxial source/drain regions.

11. A method comprising:
    forming a first set of epitaxial regions corresponding to a first set of transistors;
    forming a second set of epitaxial regions corresponding to a second set of transistors;
    forming a sacrificial epitaxial layer on top of said second set of epitaxial regions;
    converting at least a top portion of said first set of epitaxial regions into a first metal silicide and said sacrificial epitaxial layer into a sacrificial silicide layer in a first silicidation process;

removing said sacrificial silicide layer selectively, without affecting said first metal silicide, to expose underneath said second set of epitaxial regions; and converting at least a top portion of said second set of epitaxial regions into a second metal silicide.

12. The method of claim 11, wherein forming said sacrificial epitaxial layer comprises epitaxially growing a germanium layer on top of said second set of epitaxial regions.

13. The method of claim 11, further comprising:

wherein selectively removing said sacrificial silicide layer comprises exposing both said first metal silicide and said sacrificial silicide layer to an etching process wherein said etching process selectively removes said sacrificial silicide layer without significantly affecting said first metal silicide.

14. The method of claim 12, further comprising performing ion implantation, after forming said sacrificial epitaxial layer on top of said second set of epitaxial layer and before converting said at least a top portion of said first set of epitaxial regions into said first metal silicide, into said first set of epitaxial regions while said sacrificial epitaxial layer protecting said second set of epitaxial regions from said ion implantation.

15. The method of claim 11, wherein converting said at least a top portion of said first set of epitaxial regions into said first metal silicide comprises:

depositing a first layer of metal element on top of said first set of epitaxial regions and on top of said sacrificial epitaxial layer; and causing said first layer of metal element to react with said first set of epitaxial regions and to react with said sacrificial epitaxial layer to form said first metal silicide and said sacrificial silicide layer, respectively.

16. The method of claim 15, wherein converting said at least a top portion of said second set of epitaxial regions into said second metal silicide comprises:

depositing a second layer of metal element on top of said exposed second set of epitaxial regions and on top of said sacrificial silicide layer; and causing said second layer of metal element to react with said second set of epitaxial regions to form said second metal silicide while said first metal silicide stays substantially unaffected.

17. The method of claim 11, wherein said first and second set of epitaxial regions are source/drain regions of said first and second set of transistors, respectively, with said first set of transistors being p-type transistors and said second set of transistors being n-type transistors.

18. A method comprising:

forming a first epitaxial region in a first region of a semiconductor substrate;

forming a sacrificial epitaxial layer on top of said first epitaxial region;

forming a second epitaxial region in a second region of said semiconductor substrate;

depositing a layer of a first metal element on top of said second epitaxial region and on top of said sacrificial epitaxial layer and subsequently causing said second epitaxial region and said sacrificial epitaxial layer to form a second metal silicide and a sacrificial silicide layer respectively;

removing said sacrificial silicide layer selectively to said second metal silicide, thereby exposing underneath said first epitaxial region; and depositing a layer of a second metal element on top of said exposed first epitaxial region and on top of said sacrificial silicide layer and subsequently causing said exposed first epitaxial region to form a first metal silicide.

19. The method of claim 18, wherein said second metal silicide remains substantially unaffected while causing said exposed first epitaxial region to form said first metal silicide.

20. The method of claim 18, further comprising performing ion implantation into said second epitaxial region before causing said second epitaxial region to form said second metal silicide or performing ion implantation into said second metal silicide after causing said second epitaxial region to form said second metal silicide.

* * * * *